United States Patent
Liu et al.

(10) Patent No.: US 10,261,721 B2
(45) Date of Patent: Apr. 16, 2019

(54) MEMORY SYSTEM AND OPERATING METHOD THEREOF

(71) Applicant: MACRONIX INTERNATIONAL CO., LTD., Hsinchu (TW)

(72) Inventors: Yi-Chun Liu, Hsinchu (TW); Shih-Chou Juan, Taoyuan (TW); Nai-Ping Kuo, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/587,641

(22) Filed: May 5, 2017

(65) Prior Publication Data

US 2018/0321873 A1 Nov. 8, 2018

(51) Int. Cl.
| | |
|---|---|
| *G11C 16/10* | (2006.01) |
| *G06F 3/06* | (2006.01) |
| *G11C 16/14* | (2006.01) |
| *G11C 8/06* | (2006.01) |
| *G11C 16/08* | (2006.01) |
| *G11C 16/16* | (2006.01) |
| *G11C 16/32* | (2006.01) |
| *G11C 16/34* | (2006.01) |

(52) U.S. Cl.
CPC .......... *G06F 3/0653* (2013.01); *G06F 3/061* (2013.01); *G06F 3/065* (2013.01); *G06F 3/0652* (2013.01); *G06F 3/0656* (2013.01); *G06F 3/0659* (2013.01); *G06F 3/0688* (2013.01); *G11C 8/06* (2013.01); *G11C 16/08* (2013.01); *G11C 16/10* (2013.01); *G11C 16/14* (2013.01); *G11C 16/16* (2013.01); *G11C 16/32* (2013.01); *G11C 16/3459* (2013.01)

(58) Field of Classification Search
CPC ... G11C 16/3459; G11C 16/14; G06F 3/0653; G06F 3/0688; G06F 3/0652; G06F 3/0656

See application file for complete search history.

(56) References Cited

U.S. PATENT DOCUMENTS

| | | | | |
|---|---|---|---|---|
| 6,937,513 | B1* | 8/2005 | Desai | G11C 16/08 365/185.11 |
| 7,911,840 | B2 | 3/2011 | Wu et al. | |
| 8,806,115 | B1 | 8/2014 | Patel et al. | |
| 9,037,820 | B2 | 5/2015 | Ratn et al. | |
| 9,478,271 | B2 | 10/2016 | Chen et al. | |
| 9,524,791 | B1 | 12/2016 | Kim et al. | |
| 2007/0133277 | A1* | 6/2007 | Kawai | G11C 11/5628 365/185.03 |
| 2008/0080238 | A1* | 4/2008 | Yuda | G11C 11/5671 365/185.03 |

(Continued)

*Primary Examiner* — Douglas King
(74) *Attorney, Agent, or Firm* — McClure, Qualey & Rodack, LLP

(57) ABSTRACT

A memory system includes a first flash memory, a second flash memory and a controller. The first flash memory includes a memory array divided into a plurality of pages. The controller is coupled to the first flash memory and the second flash memory and configured to: control the second flash memory to record an address of a particular page in the first flash memory before programming the particular page; and control the second flash memory to record a program status of the particular page after the particular page has been programed.

20 Claims, 5 Drawing Sheets

(56) References Cited

U.S. PATENT DOCUMENTS

| | | | |
|---|---|---|---|
| 2009/0316490 A1* | 12/2009 | Takada ................. | G11C 7/1006 365/185.26 |
| 2013/0272068 A1* | 10/2013 | Matranga ............... | G11C 16/16 365/185.12 |
| 2014/0146606 A1* | 5/2014 | Nazarian ............ | G11C 16/0416 365/185.03 |
| 2015/0026393 A1* | 1/2015 | Kaminaga ............. | G06F 3/0611 711/103 |
| 2016/0343448 A1* | 11/2016 | Gueta ...................... | G11C 7/24 |

* cited by examiner

MEMORY SYSTEM AND OPERATING METHOD THEREOF

TECHNICAL FIELD

The disclosure relates in general to a memory system and an operating method thereof.

BACKGROUND

Flash memory has been widely used in various electric products. The flash memory is a type of non-volatile memory which can retain its data when power is off. However, the flash memory may be left in an incomplete state by a power failure event as data operations (e.g., program/erase operation) in progress.

SUMMARY

The disclosure is directed to a memory system and an operation method thereof. The memory system includes a first flash memory and a second memory. As a page in the first flash memory is to be programmed, the address, e.g., physical address, of the page will be recorded in the second flash memory. Further, after the page has been programmed, the second flash memory also records the corresponding program status (e.g., a program finish tag) of the page. After that, by checking information recorded in the second flash memory, an insufficient programmed page such as caused by the power failure can be identified. An insufficient program handling procedure for dealing with the insufficient programmed page can be performed only when the insufficient programmed page is detected. Therefore, the performance, boot time and write amplification of the memory system can be improved.

According to one embodiment, a memory system is provided. The memory system includes a first flash memory, a second flash memory and a controller. The first flash memory includes a memory array divided into a plurality of pages. The controller is coupled to the first flash memory and the second flash memory and configured to: control the second flash memory to record an address of a particular page in the first flash memory before programming the particular page; and control the second flash memory to record a program status of the particular page after the particular page has been programed.

According to another embodiment, an operating method of a memory system is provided, wherein the memory system includes a first flash memory, a second flash memory and a controller coupled to the first flash memory and the second flash memory, wherein the first flash memory includes a memory array divided into a plurality of pages. The operating method includes: controlling the second flash memory to record an address of a particular page in the first flash memory by the controller before the particular page is programmed; and controlling the second flash memory to record a program status of the particular page by the controller after the particular page has been programed.

Figure 1:
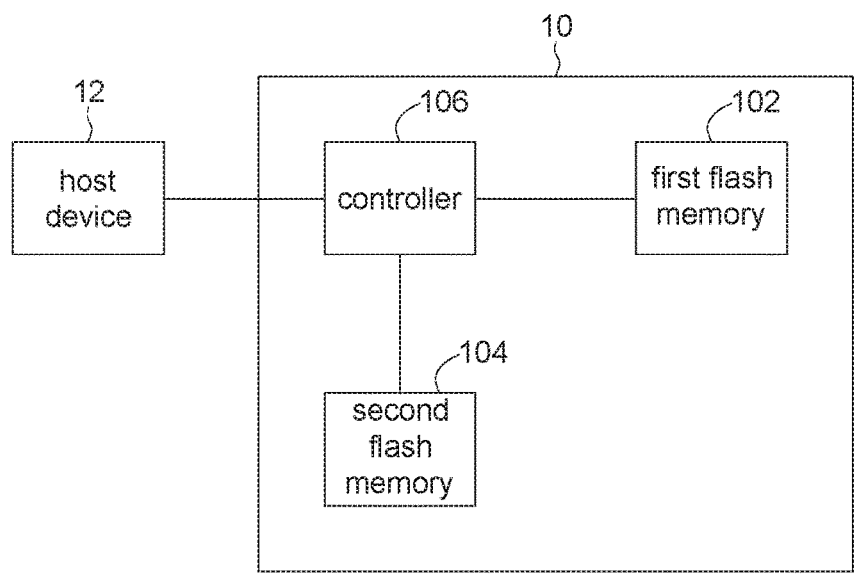
FIG. 1 is a block diagram illustrating a memory system in accordance with an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 is a block diagram illustrating a memory system 10 in accordance with an embodiment of the present disclosure.

The memory system 10 may include one or more first flash memories 102, one or more second flash memories 104 and a controller 106. For simplicity, only one first flash memory 102 and only one second flash memory 104 will be described as an example.

The first flash memory 102 can be a NAND flash memory. The second flash memory 104 can be a NOR flash memory. In some embodiments, the first flash memory 102 can be replaced with a phase change memory (PCM) or any other page-program based non-volatile memory. The second flash memory 104 can be replaced by a magnetoresistive random access memory (MRAM) or any other byte-addressable non-volatile memory.

The controller 106 is coupled to the first flash memory 102 and the second flash memory 104, which may analyze and process a request and/or an instruction provided from the host device 12, and perform the various functionalities described throughout this disclosure.

The controller 106 can be realized in the form of hardware, software or the combination thereof. For example, the controller 106 may be implemented by a micro-processing circuit, a microcontroller, a digital signal processing (DSP) circuit, a programmable logic device (PLD), a state machine, a discrete hardware circuit or any other suitable control logics.

Figure 2:
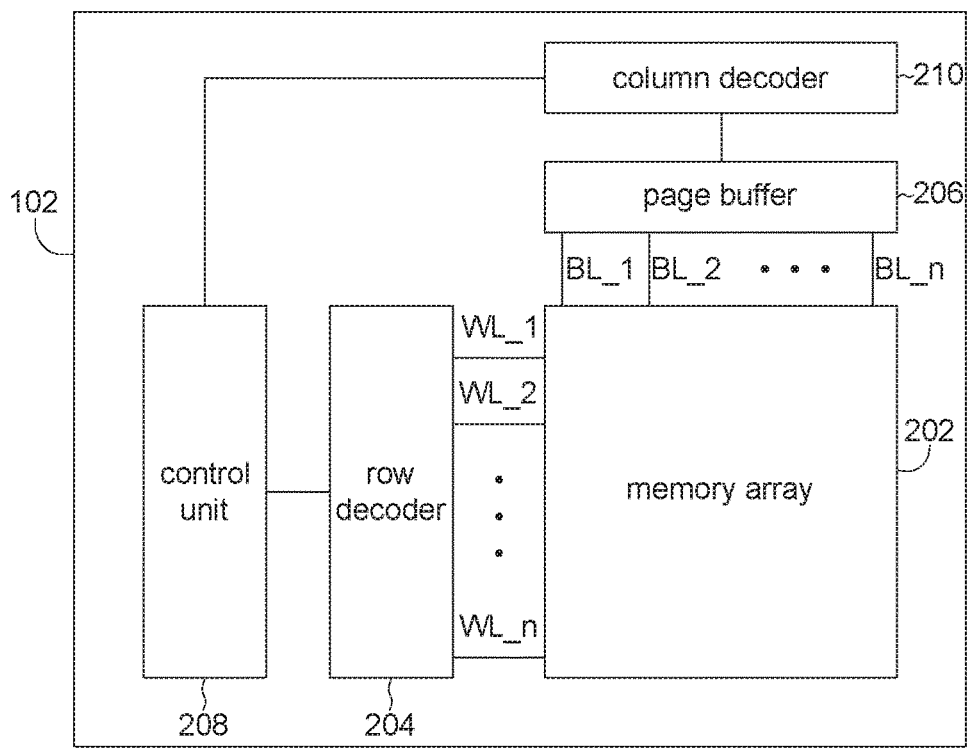
FIG. 2 is a block diagram illustrating the first flash memory in accordance with an embodiment of the present disclosure.

FIG. 2 is a block diagram illustrating the first flash memory 102 in accordance with an embodiment of the present disclosure. The first flash memory 102 includes a memory array 202, a row decoder 204, a page buffer 206, a control unit 208 and a column decoder 210.

The memory array 202 may include a plurality of memory cells. The memory cell may be grouped as memory blocks or pages depending on the electrical operation taking place. For example, the memory cells in the memory array 202 may be grouped as a plurality of pages, with each being used as a basic unit of a program operation in the NAND flash memory.

The row decoder 204 is coupled to the memory array 202 through one or more word lines WL1-WL_m. The row decoder 204 is controlled by the control unit 208, which may decode an address provided from the controller 106, and select and drive the word lines WL_1-WL_m according to a decoding result.

The page buffer 206 is coupled to the memory array 202 though one or more bit lines BL_1-BL_n. Write data from the controller 106 can be sequentially loaded into the page buffer 206 via the column decoder 210. Before a particular page in the memory array 202 is programmed, the write data will be stored in the page buffer 206 first.

The control unit 208 is coupled to the row decoder 204 and the column decoder 210. The control unit 208 may perform general memory operations such as program, read and erase operations on the memory array 202 in response to a control command provided from the controller 106. In an embodiment, the control unit 208 can be a device controller mounted in the first flash memory 102, which can be realized in the form of hardware, software and the combination thereof.

Figure 3:
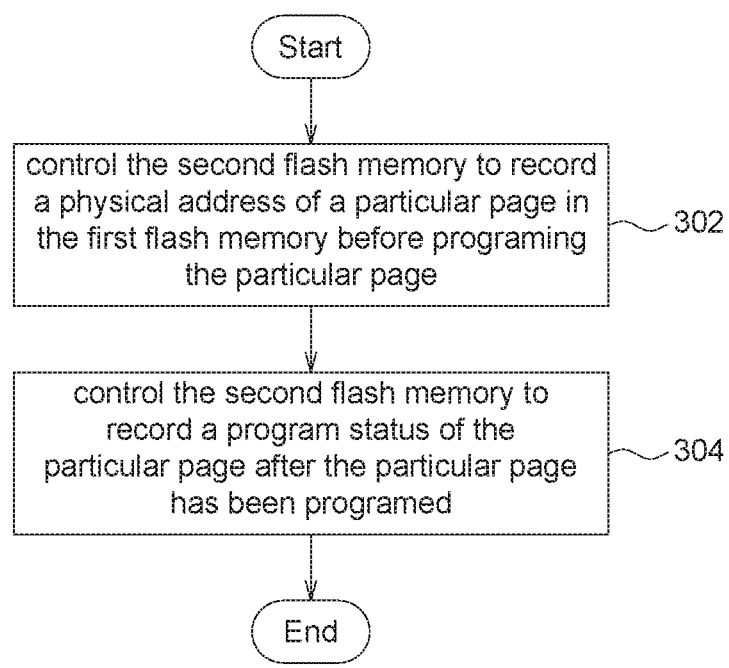
FIG. 3 is a flowchart illustrating an operating method of the memory system in accordance with an embodiment of the present disclosure.

FIG. 3 is a flowchart illustrating an operating method of the memory system in accordance with an embodiment of the present disclosure. For illustration, the memory system described herein is exemplified as the memory system 10 shown in FIG. 1.

In step 302, the controller 106 controls the second flash memory 104 to record an address, e.g., physical address, of a particular page in the first flash memory 102 before programing the particular page.

The particular page generally refers to a page in the first flash memory 102 that is selected to be written data. A program operation is initiated by a program command provided from the controller 106. When the first flash memory 102 receives the program command from the controller 106, the write data will be placed in the page buffer 206 first. The first flash memory 102 then waits for a further instruction (e.g., a confirm command) from the controller 106. Only when the confirm command is received, the first flash memory 102 programs write data in the page buffer into the particular page. At this time, the particular page is programmed.

According to embodiments of the present disclosure, before a particular page is programmed, i.e., the particular page has not yet been programmed, the controller 106 may control the second flash memory 104 to record the physical address of the particular page. As a result, even if power is suddenly cut off in the course of programming the particular page, the insufficiently programmed particular page can be identified by searching the recorded data of the second flash memory 104.

In step 304, the controller 106 controls the second flash memory 104 to record a program status of the particular page after the particular page has been programed.

For example, after the particular page has been programmed, the controller 106 may perform a verify operation on the programmed particular page. During the verify operation, a tight threshold voltage setting is applied to determine whether the particular page is programmed successfully. If a resulting error bit count is lower than a predetermined value, the particular page is programmed successfully, i.e., passes the verify operation, and the controller 106 controls the second flash memory 104 to record the program status of the particular page. On the contrary, if the resulting error bit count exceeds the predetermined value, the particular page is programmed unsuccessfully, and a fail status is reported to the controller 106.

In the above manner, if the program operation for the particular page is completed, e.g., no power failure event occurs during the program operation, both the physical address and the program status of the particular page will be recorded in the second flash memory 104. Conversely, if the program operation for the particular page is uncompleted, e.g., power is suddenly cut off during the program operation, the second flash memory 104 might record the physical address of the particular page, while no corresponding program status is recorded. Due to the power failure event, the program status of the particular page cannot be recorded in the second flash memory 104. Accordingly, the controller 106 may identify whether the particular page is programed completely or not by checking whether the program status of the particular page is presented in the second flash memory 104 if the physical address of the particular page has been recoded by the second flash memory 104. If both the physical address and the program status of the particular page are recorded in the second flash memory 104, the particular page is deemed as a completed programmed page that does not suffer any power failure event; otherwise, if the physical address of the particular page is presented in the second flash memory 104 but the program status of the particular page is not, the particular page is deemed as an insufficient programmed page that might suffer the power failure event.

In an embodiment, when the second flash memory 104 is disabled (or deactivated) by the controller 106, the controller 106 controls the first flash memory 102 to record data retention information of the second flash memory 104, e.g., threshold voltage (Vt) distributions of the cells in the second flash memory 104.

Figure 4:
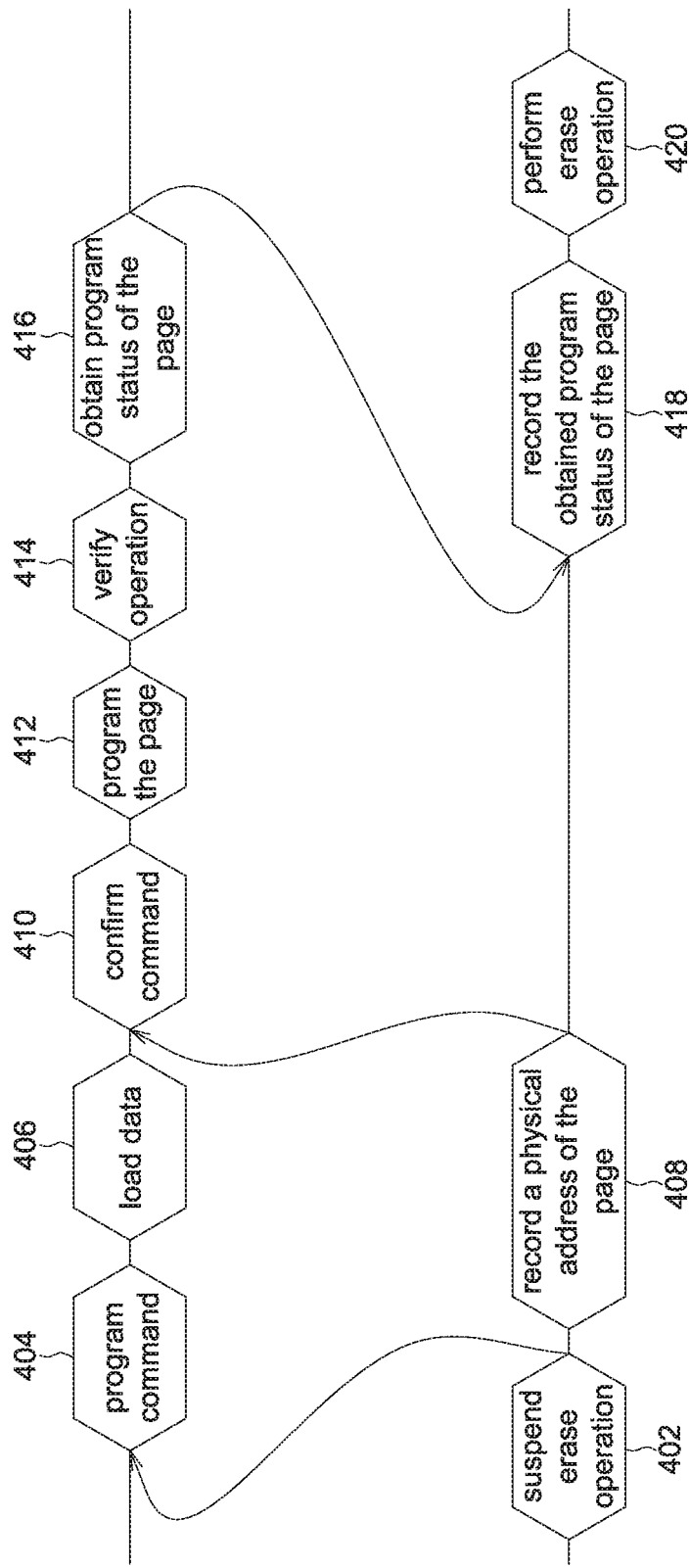
FIG. 4 is a timing diagram illustrating the signal operation of the memory system in accordance with an embodiment of the present disclosure.

FIG. 4 is a timing diagram illustrating the signal operation of the memory system in accordance with an embodiment of the present disclosure. For illustration, the memory system is exemplified as the memory system 10 shown in FIG. 1. Further, the sequence including states 404, 406, 410, 412, 414 and 416 shown in the upper portion of this figure represents operations performed on the first flash memory 102, and the sequence including states 402, 408, 418 and 420 shown in the lower portion of the figure represents operations performed on the second flash memory 104.

In state 402, an erase operation on the second flash memory 104 in progress is suspended.

Specifically, if the controller 106 is going to initiate a program operation on a particular page in the first flash memory 102, the controller 106 may first determine whether the second flash memory 104 is operated in a state that is available to record associated information of the particular page. If the determination result is negative, e.g., the erase operation on the second flash memory 104 is in progress, the controller 106 suspends the erase operation. If the determination result is positive, the controller 106 may transmit a program command to the first flash memory 102 to initiate the program operation, as shown in state 404.

In state 404, the controller 106 transmits a program command to the first flash memory 102 to request programming a particular page.

In an embodiment, conditioned on determining that a memory space of the second flash memory 104 is insufficient to record the physical address and the program status of the particular page, the controller 106 may wait for the erase operation on the second flash 104 to finish before transmitting the program command to the first flash memory 102.

In state 406, after the first flash memory 102 receives the program command provided from the controller 106, the write data for the particular page is loaded into the page buffer 206 of the first flash memory 102.

Meanwhile, in state 408, the controller 106 controls the second flash memory 104 to record the physical address of the particular page, i.e., the location in the first flash memory 102 that the data is to be written in.

In state 410, after the second flash memory 104 has recorded the physical address of the particular page and the write data has been loaded into the page buffer 206, the controller 106 transmits a confirm command to the first flash memory 102 to enable the first flash memory 102 to program the particular page in the memory array 202 with the write data of the page buffer 206.

Because in state 408 the second flash memory 104 just needs few bytes of program time to log the physical address messages, the logging of the physical address messages on the second flash memory 104 can be done in the course of state 406. In other words, as state 406 is finished, the controller 106 can continue to transmit the confirm command to the first flash memory 102, and the programming performance of the first flash memory 102 would not be affected.

Then, in state 412, the particular page in the memory array 202 of the first flash memory 102 is programmed. The first flash memory 102 responds the received confirm command to program the particular page with the write data in the page buffer 206.

In state 414, the controller 106 verifies the programmed particular page, and then obtains a program status of the particular page in state 416. As an example, the program status of the particular page may include a flag indicating that the corresponding particular page has been programmed successfully.

Then, in state 418, the controller 106 controls the second flash memory 104 to record the obtained program status of the particular page.

In the above manner, only when the programming for the particular page have finished, the second flash memory 104 records the corresponding program status of the particular page. For a particular page whose physical address has been recorded in the second flash memory 104, the controller 106 may determine whether the particular page has been completely programmed or not by checking, as the system is power on, whether the program status of the particular page is presented in the second flash memory 104. If the program status of the particular page is presented in the second flash memory 104, it means that the particular page has been normally programmed. On the contrary, if the second flash memory 104 records the physical address of the particular page while no corresponding program status is recorded, it implies that the particular page is programmed incompletely. For example, the power failure event occurs during the programming for the particular page.

In state 420, after the second flash memory 104 records the physical address and the program status of the particular page, the controller 106 performs an erase operation on the second flash memory 104 to make a space of the second flash memory 104 available to store the physical address and the program status of a next page to be programmed.

In summary, for each page in the first flash memory 102 that is selected to be programmed, the controller 106 may control the second flash memory 104 to record the page's physical address before the page is programmed, and record the page's program status after the page has been programmed.

Figure 5:
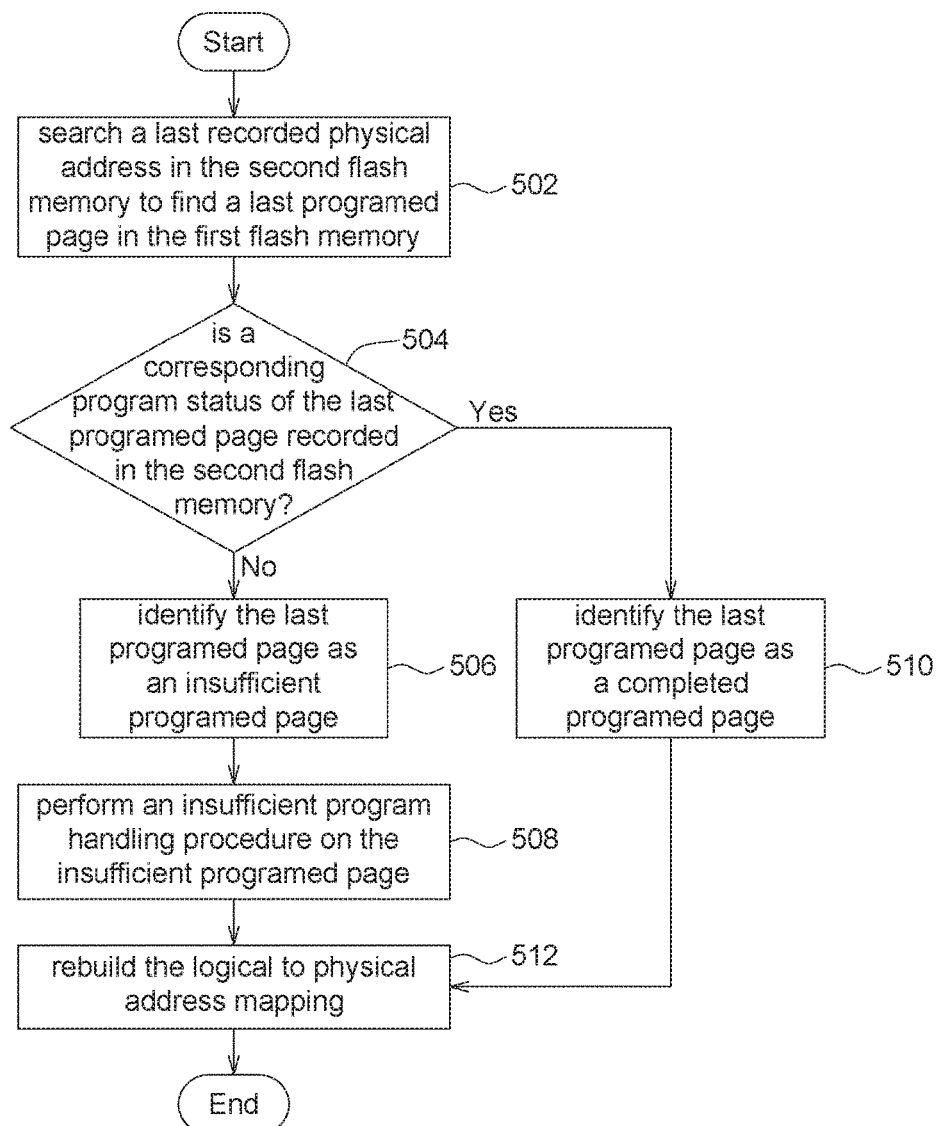
FIG. 5 is a flowchart illustrating a power failure recovery process of the memory system in accordance with an embodiment of the present disclosure.

FIG. 5 is a flowchart illustrating a power failure recovery process of the memory system in accordance with an embodiment of the present disclosure. For illustration, the memory system is exemplified as the memory system 10 shown in FIG. 1.

In step 502, after power on, the controller 106 searches a last recorded physical address in the second flash memory 104 to find a last programed page in the first flash memory 102.

In step 504, the controller 106 checks whether a corresponding program status of the last programed page is recorded in the second flash memory 104. If not, the process goes to step 506. If yes, the process advances to step 510.

In step 506, conditioned on determining that the corresponding program status of the last programed page is not recorded in the second flash memory 104, the controller 106 identifies the last programed page as an insufficient programed page such as caused by power failure. Then in step 508, the controller 106 performs an insufficient program handling procedure on the insufficient programed page for power failure recovery.

In an embodiment, during the insufficient program handling procedure, the controller 106 may determine that the insufficient programmed page is an error correction code pass (ECC-pass) page or a blank page.

The ECC-pass page described hereafter refers to a page whose data passes an ECC verification operation. If the insufficient programmed page is determined as the ECC-pass page, the power failure event might occur in the end or the last half of the program operation; therefore, the data in the insufficient programmed page can still pass the ECC verification. On the other hand, if the insufficient programmed page is determined as a blank page, the power failure event might occur in the beginning or the first half of the program operation.

When the insufficient programed page is identified as the ECC-pass page, the controller 106 may perform backup operations to retain data in the ECC-pass page. For example, conditioned on determining that data in the insufficient programed page passes the ECC verification, i.e., the insufficient programed page is identified as the ECC-pass page, the controller 106 may create a copy of the data of the insufficient programed page at a new location in the first flash memory 102.

On the other hand, conditioned on determining that the insufficient programed page is a blank page in the first flash memory 102, the controller 106 may fill dummy data in the insufficient programed page to prohibit the insufficient programed page from being used. This is because the state of the insufficient programed page which is identified as the blank page might deviate from a normal erase state due to the insufficient programming. Once such a blank page is written data through a subsequent program operation, error data probably occurs.

In an embodiment, in addition to the insufficient programmed page, blank pages possibly programmed subsequently and affected by the power failure event will be also filled the dummy data by the controller 106.

In step 510, conditioned on determining that the corresponding program status of the last programed page is recorded in the second flash memory 104, the controller 106 identifies the last programed page as a completed programed page. Because a completed programed page is not requited to be processed by the insufficient program handling procedure, the process directly goes to step 512.

In step 512, the controller 106 rebuild the logical to physical address mapping for the first flash memory 102. For example, the logical to physical address mapping is maintained by the controller 106 in a form of mapping table. The controller 106 may use the mapping table to translate a logical address provided by the host device 12 into a physical address of the first flash memory 102.

Figure 6:
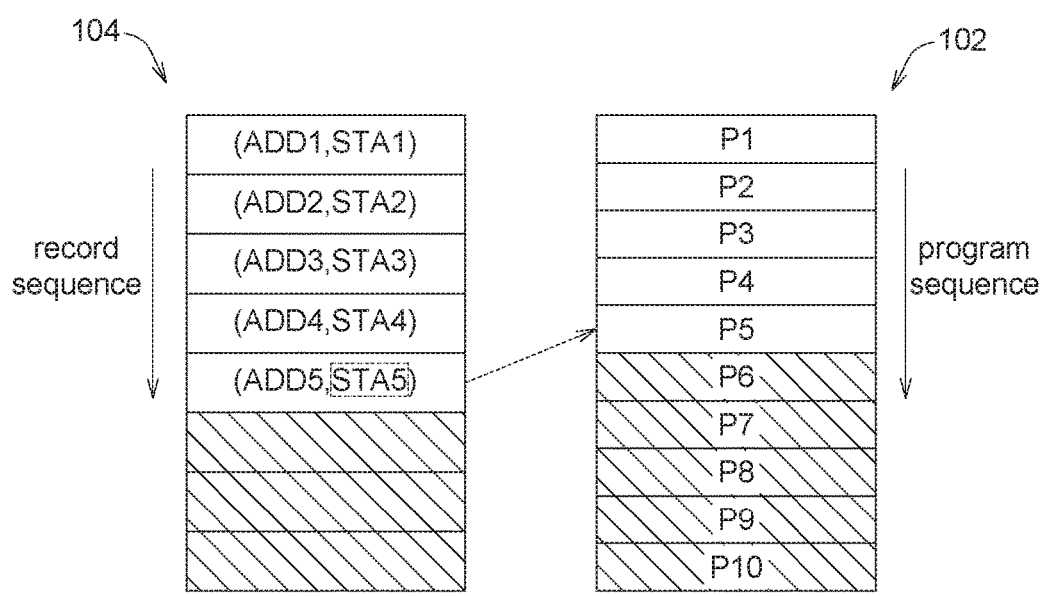
FIG. 6 is a schematic diagram illustrating states of programed pages in the first flash memory and the association information recorded in the second flash memory.

FIG. 6 is a schematic diagram illustrating states of programed pages in the first flash memory 102 and the association information recorded in the second flash memory 104.

For simplicity, only 10 pages P1 to P10 included in the first flash memory 102 will be described as an example. It is assumed that the pages P1 to P10 in the first flash memory 102 are programed sequentially.

The controller 106 may read the first flash memory 102 and detect that the pages P6-P10 are blank pages (represented as rectangles with diagonal shading in this figure), and then determines that the page P5 before the first blank page P6 in the program sequence is the last programmed page in the first flash memory 102. The last programmed page may be a completed programmed page or an insufficient programmed page that suffers power failure events.

As described above, if a page whose physical address has been recorded in the second flash memory 104 has a corresponding program status presented in the second flash memory 104, this page is a completed programmed page; otherwise, it is an insufficient programmed page. As shown in FIG. 6, the pages P1-P4 has their physical addresses ADD1-ADD4 and program statuses STA1-STA4 recorded in the second flash memory 104 respectively. Therefore, pages P1-P4 will be deemed as completed programmed pages.

For the last programmed page, P5, its physical address ADD5 is lastly recoded in the second flash memory 104. The controller 106 may check whether the corresponding program status STA5 of the page P5 is recorded in the second flash memory 104 or not. If yes, the page P5 is a completed programmed page; if not, the page P5 is an insufficient programmed page in the first flash memory 102, which requires to be recovered by the insufficient program handling procedure as described in FIG. 5 for example.

Based on the above, the proposed memory system includes a first flash memory and a second memory. As a page in the first flash memory is to be programmed, the physical address of the page will be recorded in the second flash memory. Further, after the page has been programmed, the second flash memory also records the corresponding program status (e.g., a program finish tag) of the page. After that, by checking information recorded in the second flash memory, an insufficient programmed page such as caused by the power failure can be identified. An insufficient program handling procedure for recovering the insufficient programmed page can be performed only when the insufficient programmed page is detected. Therefore, the performance, boot time and write amplification of the memory system can be improved.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory system, comprising:
    a first flash memory comprising a memory array, wherein the memory array is divided into a plurality of pages;
    a second flash memory, wherein the first flash memory and the second flash memory are different type of flash memories; and
    a controller coupled to the first flash memory and the second flash memory and configured to:
    control the second flash memory to record an address of a particular page in the first flash memory before programming the particular page; and
    control the second flash memory to record a program status of the particular page after the particular page has been programmed,
    wherein when the controller identifies a last programed page in the first flash memory as an insufficient programed page and determines that the insufficient programed page is a blank page in the first flash memory, the controller fills dummy data in the insufficient programed page.

2. The memory system according to claim 1, wherein the first flash memory further comprises:
    a page buffer coupled to the memory array, configured to store write data for the particular page;
    wherein before transmitting a confirm command to the first flash memory to enable the first flash memory to program the particular page with the write data in the page buffer, the controller is further configured to control the second flash memory to record the address of the particular page.

3. The memory system according to claim 1, wherein the controller is further configured to:
    before transmitting a program command to the first flash memory, suspend an erase operation of the second flash memory in progress.

4. The memory system according to claim 1, wherein the controller is further configured to:
    conditioned on determining that a memory space of the second flash memory is insufficient to store the address and the program status of the particular page, wait for an erase operation of the second flash memory to finish before transmitting a program command to the first flash memory.

5. The memory system according to claim 1, wherein the controller is further configured to:
    verify the first flash memory to obtain the program status of the particular page; and
    control the second flash memory to record the obtained program status of the particular page.

6. The memory system according to claim 1, wherein the controller is further configured to:
    after the second flash memory has recorded the address and the program status of the particular page, perform an erase operation on the second flash memory.

7. The memory system according to claim 1, wherein when the controller identifies a last programed page in the first flash memory as an insufficient programed page, the controller is further configured to:

find the last programed page in the first flash memory;
check whether a corresponding program status of the last programed page is recorded in the second flash memory;
conditioned on determining that the corresponding program status of the last programed page is not recoded in the second flash memory, identify the last programed page as the insufficient programed page; and
perform an insufficient program handling procedure on the insufficient programed page.

8. The memory system according to claim 7, wherein the insufficient program handling procedure comprises:
conditioned on determining that the insufficient programed page passes an error correction code (ECC) verification, the controller creates a copy of data of the insufficient programed page at a new location in the first flash memory.

9. The memory system according to claim 1, wherein the second flash memory is a NOR flash memory.

10. The memory system according to claim 1, wherein the controller is further configured to:
disable the second flash memory; and
control the first flash memory to record data retention information of the second flash memory when the second flash memory is disabled.

11. An operating method of a memory system, wherein the memory system comprises a first flash memory, a second flash memory and a controller coupled to the first flash memory and the second flash memory, the first flash memory comprises a memory array divided into a plurality of pages, and the operating method comprises:
controlling the second flash memory to record an address of a particular page in the first flash memory by the controller before the particular page is programed, wherein the first flash memory and the second flash memory are different type of flash memories; and
controlling the second flash memory to record a program status of the particular page by the controller after the particular page has been programed,
wherein when the controller identifies a last programed page in the first flash memory as an insufficient programed page and determines that the last programed page is a blank page in the first flash memory, the controller fills dummy data in the last programed page.

12. The operating method according to claim 11, wherein the first flash memory further comprises a page buffer coupled to the memory array and configured to store write data for the particular page, and the operating method further comprises:
before transmitting a confirm command to the first flash memory to enable the first flash memory to program the particular page with the write data in the page buffer, controlling the second flash memory to record the address of the particular page by the controller.

13. The operating method according to claim 11, further comprising:
before transmitting a program command to the first flash memory, suspending an erase operation of the second flash memory in progress by the controller.

14. The operating method according to claim 11, further comprising:
conditioned on determining that a memory space of the second flash memory is insufficient to store the address and the program status of the particular page, waiting for an erase operation of the second flash memory to finish before transmitting a program command to the first flash memory by the controller.

15. The operating method according to claim 11, further comprising:
verifying the first flash memory to obtain the program status of the particular page by the controller; and
controlling the second flash memory to record the obtained program status of the particular page by the controller.

16. The operating method according to claim 11, further comprising:
after the second flash memory has recorded the address and the program status of the particular page, performing an erase operation on the second flash memory by the controller.

17. The operating method according to claim 11, wherein when the controller identifies a last programed page in the first flash memory as an insufficient programed page, the operation method further comprising:
finding the last programed page in the first flash memory by the controller;
checking whether a corresponding program status of the last programed page is recorded in the second flash memory by the controller;
conditioned on determining that the corresponding program status of the last programed page is not recoded in the second flash memory, identifying the last programed page as the insufficient programed page by the controller; and
performing an insufficient program handling procedure on the insufficient programed page by the controller.

18. The operating method according to claim 17, wherein the insufficient program handling procedure comprises:
conditioned on determining that the insufficient programed page passes an error correction code (ECC) verification, creating a copy of data of the insufficient programed page at a new page in the first flash memory by the controller.

19. The operating method according to claim 11, wherein the second flash memory is a NOR flash memory.

20. The operating method according to claim 11, further comprising:
disabling the second flash memory; and
controlling the first flash memory to record data retention information of the second flash memory when the second flash memory is disabled.

* * * * *